(12) United States Patent
Peake et al.

(10) Patent No.: US 6,979,865 B2
(45) Date of Patent: Dec. 27, 2005

(54) CELLULAR MOSFET DEVICES AND THEIR MANUFACTURE

(75) Inventors: Steven Thomas Peake, Chesire (GB); Christopher Martin Rogers, Manchester (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/503,171

(22) PCT Filed: Jan. 23, 2003

(86) PCT No.: PCT/IB03/00219

§ 371 (c)(1),
(2), (4) Date: Jul. 30, 2004

(87) PCT Pub. No.: WO03/067665

PCT Pub. Date: Aug. 14, 2003

(65) Prior Publication Data

US 2005/0082611 A1    Apr. 21, 2005

(30) Foreign Application Priority Data

Feb. 2, 2002    (GB) ................................ 0202437

(51) Int. Cl.[7] .............................................. H01L 21/8234
(52) U.S. Cl. .................. 257/341; 257/471; 257/330; 438/268; 438/270
(58) Field of Search ........................... 257/330–346, 257/280–288, 471–478; 438/268–274

(56) References Cited

U.S. PATENT DOCUMENTS

| 4,521,795 A | 6/1985 | Coe et al. |
| 4,754,310 A | 6/1988 | Coe |
| 6,049,108 A | 4/2000 | Williams et al. |
| 6,444,527 B1 * | 9/2002 | Floyd et al. ................. 438/268 |

FOREIGN PATENT DOCUMENTS

WO    WO0051167    8/2000

* cited by examiner

*Primary Examiner*—H. Jey Tsai (57) ABSTRACT

A cellular MOSFET device has a cellular area (CA) comprising active MOSFET cells, and one or more Schottky diode areas (SA) accommodated within a deep end region (15) at a lateral boundary of this cellular area (CA). This deep end region (150) is laterally divided so as to accommodate the diode area (SA) therein. A diode portion (14d) of the first conductivity type of the drain region (14) extends upwardly through the laterally-divided deep end region (150) that is of the second conductivity type. The Schotty barrier (100) formed with this diode portion (14d) terminates laterally in the laterally-divided portions (150 *deep end region* (150) which serve as a guard region and field-relief region for the Schottky diode.

13 Claims, 5 Drawing Sheets

CELLULAR MOSFET DEVICES AND THEIR MANUFACTURE

This invention relates to cellular MOSFET devices (i.e. cellular insulated-gate field-effect transistor devices), and to their manufacture. The invention relates particularly to the integration of a Schottky diode at a diode area of the body, in parallel with a conduction channel of the MOSFET.

Cellular insulated-gate field-effect transistor devices are well known as power switches in a variety of applications. The devices comprise active device cells in a cellular area of a semiconductor body. Each active device cell has a channel-accommodating region of a second conductivity type between a surface-adjacent source region and an underlying drain region that are of a first conductivity type. A gate electrode is dielectrically coupled to the channel-accommodating region for controlling a conduction channel between the source and drain regions in operation of the device. Although commonly designated "MOSFET", it should be noted that the gate electrode need not be metal (but is often of conductively-doped polysilicon) and that the gate dielectric need not be oxide. The MOSFET cells may be of DMOS type (having a planar gate at the body surface) or of trench-gate type (having the gate in a trench extending through the channel-accommodating region). Typically, the cellular area is laterally bounded by an end structure including a deep end region of the second conductivity type that adjoins the channel-accommodating region. This end region has a greater depth and a higher doping concentration than the channel-accommodating region.

It is known from United States patent U.S. Pat. No. 4,521,795 (Philips ref: PHB32842) to incorporate a Schottky diode at a diode area of the device body, in parallel with the MOSFET channel. By this means, the switching speed of the MOSFET (e.g. when switching inductive loads) can be increased, as the Schottky diode limits charge storage at the p-n junctions between the drain region and the channel-accommodating regions in the device cells. The Schottky diode comprises a Schottky barrier integrated between the source electrode (connected to the source region and channel-accommodating region) and a diode portion of the drain region that is of the first conductivity type. In the specific embodiments depicted in U.S. Pat. No. 4,521,795, Schottky diode areas are incorporated in the MOSFET cells, with the Schottky barriers preferably terminating laterally in an edge of the channel-accommodating region that serves as a guard ring for the Schottky diode.

U.S. Pat. No. 4,521,795 discloses Schottky diode integration with both DMOS-type cells and trench-gate cells. United States patent U.S. Pat. No. 6,049,108 and published PCT international patent application WO-00/51167 disclose various specific layout geometries for integrating Schottky diodes in trench-gate MOSFET designs. In particular, U.S. Pat. No. 6,049,108 teaches dedicating a selected number of the cells to such diodes at predetermined locations in the cellular area, whereas WO-00/51167 discloses integrating the diodes between neighbouring trench-gates in, for example, an elongate stripe cell geometry. The whole contents of U.S. Pat. No. 4,521,795, U.S. Pat. No. 6,049,108 and WO-00/51167 are hereby incorporated herein as reference material.

It is an aim of the present invention to integrate such a Schottky diode in a more advantageous configuration within the MOSFET device, with good Schottky characteristics, and to permit such integration in a simple, reliable and low-cost manufacturing process.

According to a first aspect of the invention, in a cellular MOSFET device having a cellular area comprising active MOSFET cells, the Schottky diode area is accommodated within the deep end region at a lateral boundary of this cellular area. This deep end region is laterally divided so as to accommodate the diode area therein. A diode portion of the first conductivity type of the drain region extends upwardly through the laterally-divided deep end region that is of the second conductivity type. The Schottky barrier formed with this diode portion terminates laterally in the laterally-divided portions of the deep end region which serve as a field-relief region for the Schottky diode.

Such an integration scheme in accordance with the invention has several advantages.

The overall size and pitch of the active device cells is not affected by this Schottky diode integration, and so the active device cells can be compact. As such, a compact cellular layout with high current capability and low on-resistance can be maintained for the MOSFET.

However, there is plenty of layout area available for accommodating the Schottky diode in end structures at the lateral boundary of a cellular area. As such, one or more Schottky barriers of large area can be accommodated in a compact manner in the device. Thus, the Schottky diode areas may be accommodated in one or more stripes that extend between cellular areas of the device and/or that extend around a perimeter of the whole cellular area of the device. The deep end regions can be distributed around and throughout the whole active area of the MOSFET, so suppressing parasitic bipolar transistor effects between the source and drain regions and improving the MOSFET ruggedness. These deep end regions are particularly beneficial for incorporation at the boundary of cellular areas that comprise trench-gate cells, when the deep end regions are deeper than the gate trenches.

Because of their depth, the laterally-divided end-region portions provide good relief of the electric field in the diode portion of the drain region that they laterally bound. The Schottky diode can therefore have good blocking characteristics. Indeed, the laterally divided portions of the deep end region may even have a sufficiently close spacing as to permit depletion of the diode portion of the drain region (across this close spacing) in a blocking state of the device. This is advantageous for the field-relief and for achieving a compact structure.

Field trenches containing insulating material may be included in the field-relief region of the diode in order to reduce field spreading beneath the deep end region at the lateral boundary of the diode portion of the drain region. Thus, the device may comprise one or more such field trenches which extend to a greater depth in the body than the deep end region and which laterally bound the portions of the deep end region that provide the guard region and field-relief region. However, particularly where a Schottky diode area is accommodated between cellular areas, the laterally-divided deep end region may provide a simple field-region structure for the diode without any field insulator in this area.

According to a second aspect of the present invention, there is provided a method of manufacturing such cellular MOSFET devices with integrated Schottky diodes, wherein the method comprises the steps of:

(a) providing the device body having a semiconductor body portion of a first conductivity type for a drain region of the MOSFET device, (b) locally doping the body to provide an end region of the second conductivity type for an end structure at a lateral boundary of an area of the body that provides the cellular area, which end region is laterally divided to accommodate the diode area within the end region of the end structure, with a diode portion of the drain region extending upwardly through the end region, (c) forming the active device cells in the cellular area, wherein the cells have a channel-accommodating region of a second conductivity type that adjoins the end region at a boundary of the cellular area, and wherein the end region resulting from the local doping of step (b) has a greater depth and a higher doping concentration than the channel-accommodating region, and (d) forming at the diode area the Schottky barrier which terminates laterally in the laterally divided portions of the end region, which laterally divided portions serve as a guard region and field-relief region for the Schottky diode.

This aspect of the invention permits integration of the Schottky diode in the MOSFET device by means of a simple, reliable and low-cost manufacturing process and with good Schottky characteristics.

Various masking material layers may be provided over the diode area to mask the diode area during the formation of the active device cells in step (c).

Typically, the device termination structure may comprise a field insulator. In this case, an extra area of the field insulator may be provided also over the diode area before step (c) and serve to mask the diode area during the formation of the active device cells. This extra field-insulator area can then be removed from the diode area before forming the Schottky barrier in step (d).

In the case of a trench-gate MOSFET device, the gate trench is etched into the body in step (c) at windows in an etch-mask layer. In this case, an area of the etch-mask layer may be provided over the diode area to mask the diode area during the formation of the active device cells in step (c). This area of the etch-mask layer is removed from the diode area before forming the Schottky barrier in step (d).

Various advantageous features and feature-combinations in accordance with the present invention are set out in the appended claims. These and others are illustrated in embodiments of the invention that are now described, by way of example, with reference to the accompanying diagrammatic drawings, in which:

Figure 1:
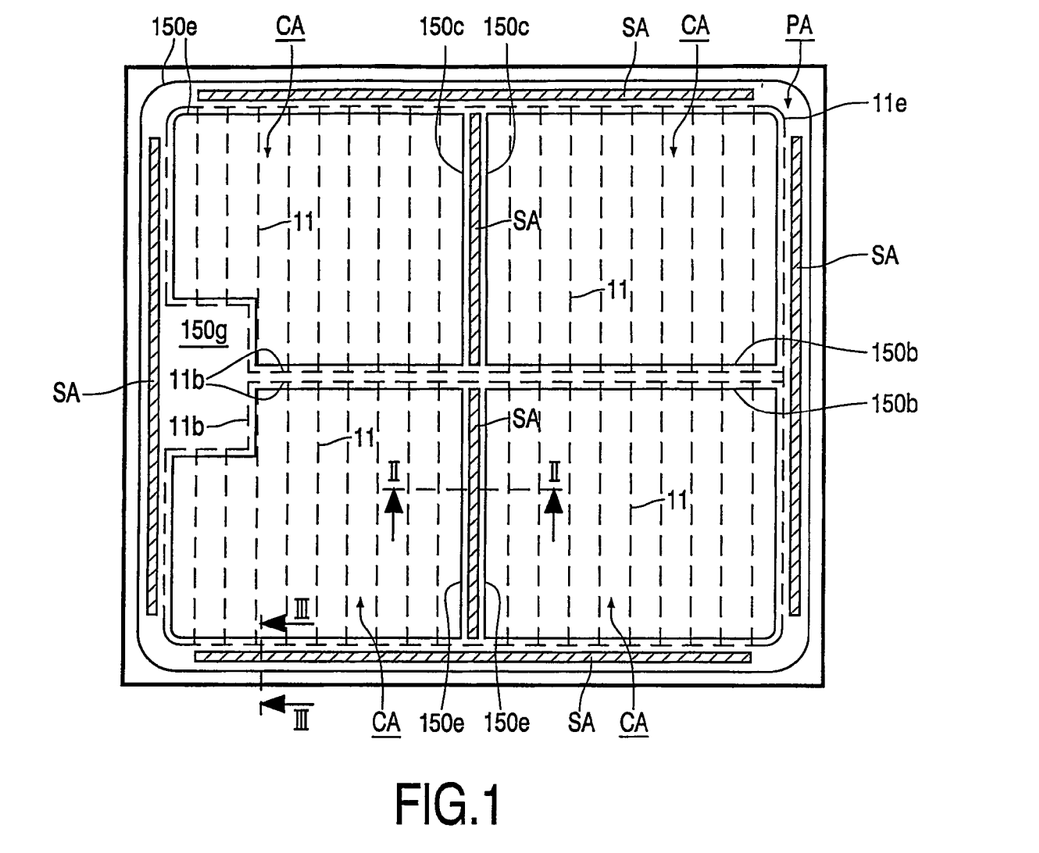
FIG. 1 is a simple plan view of one example of a trench-gate cellular MOSFET device in accordance with the invention, showing both edge-termination and cross-area configurations for deep end regions that laterally bound cellular areas.
Figure 2:
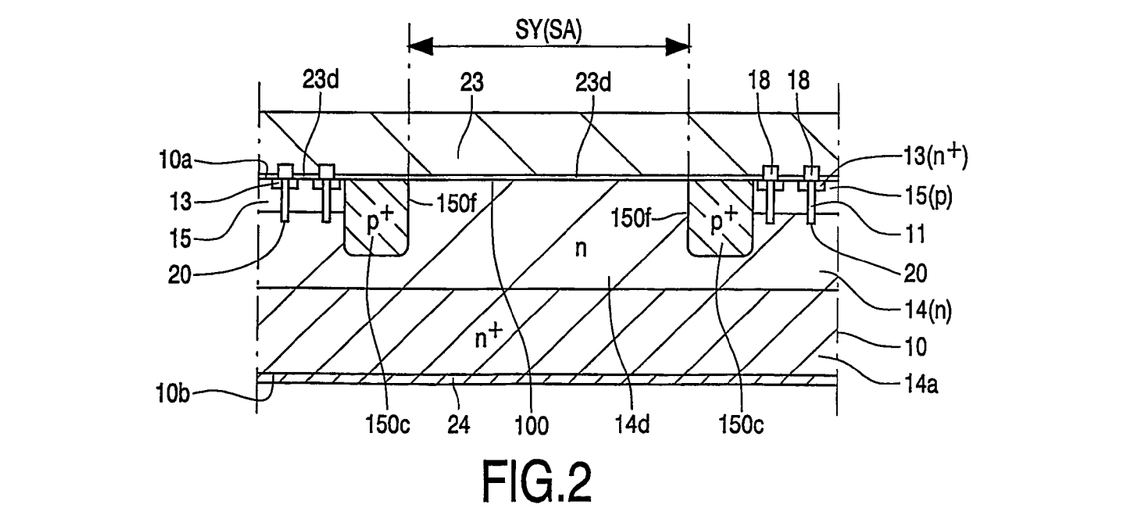
FIG. 2 is a cross-sectional view of one example of a cross-area deep end region of such a device as FIG. 1, taken on the line II—II of FIG. 1, i.e. between two cellular areas.
Figure 7:
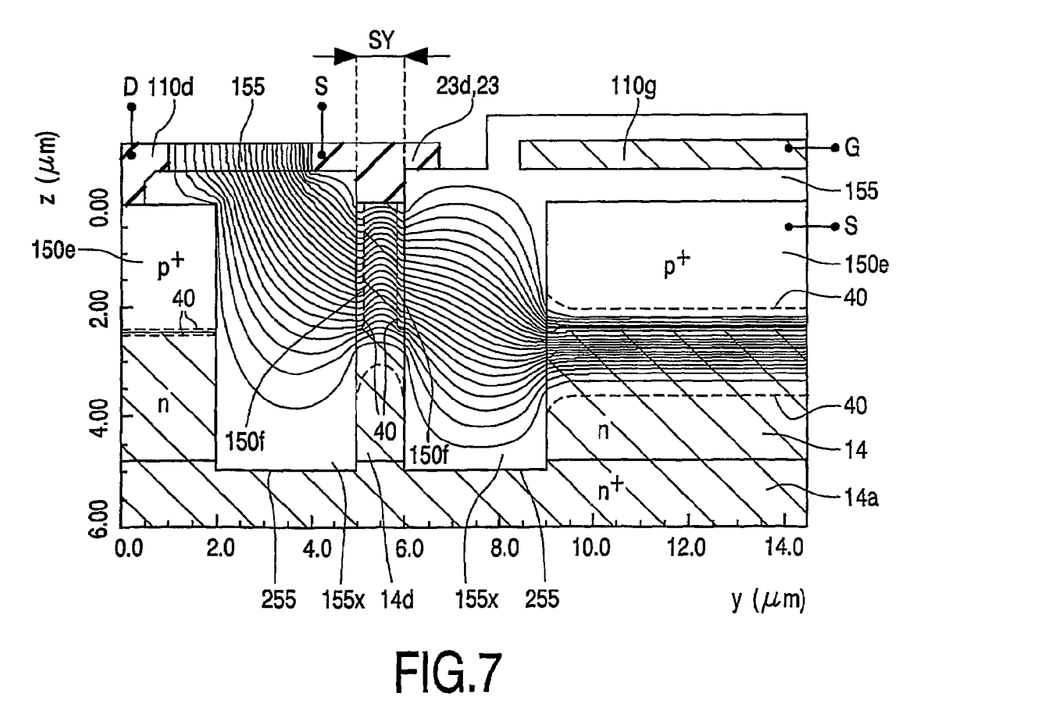
FIG. 7 is a cross-sectional view of another example of an edge-termination structure also in accordance with the invention (similar to that of FIG. 3 but including also deep field trenches), on which are superimposed simulation plots of electric field lines and depletion layers in a blocking state of the Schottky diode.
Figure 8:
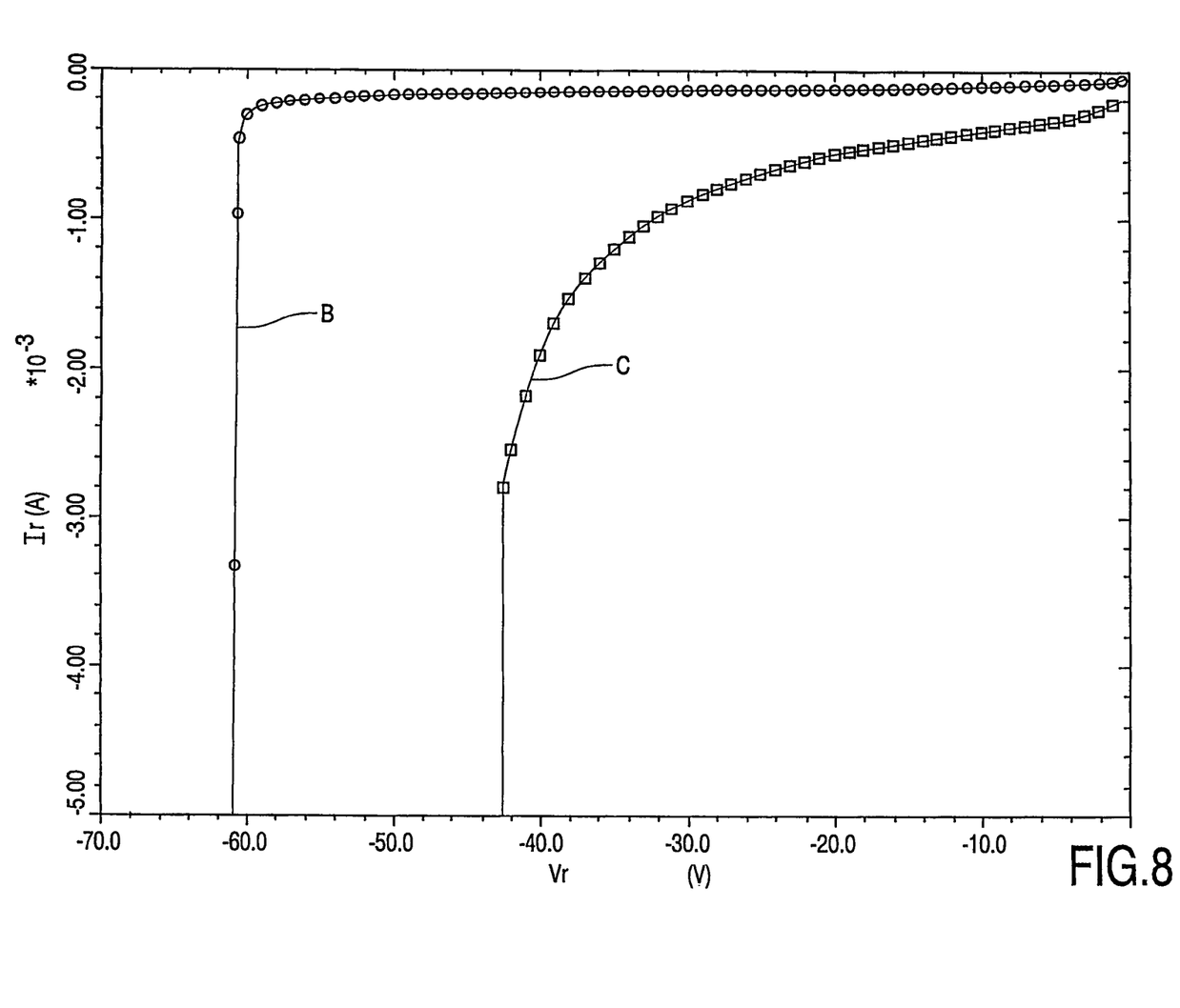
FIG. 8 is a simulation plot of leakage current Ir in $10^{-3}$ Amps against reverse voltage Vr in volts, for a Schottky diode having a deep end-region and field-trench boundary as in FIG. 7, as compared with a Schottky diode having a trench-gate boundary.

Apart from the simulation plots of FIGS. 7 and 8, all the drawings are diagrammatic, with the relative dimensions and proportions of various parts of their Figures being shown exaggerated or reduced in size, for the sake of clarity and convenience in the drawings. Thus, for example, the different spacings between the gate trenches in FIGS. 1 and 2 illustrate the degree to which the proportions are exaggerated or reduced in respective drawings, for convenience and clarity. The same reference signs are generally used to refer to corresponding or similar features in modified and different embodiments.

Figure 3:
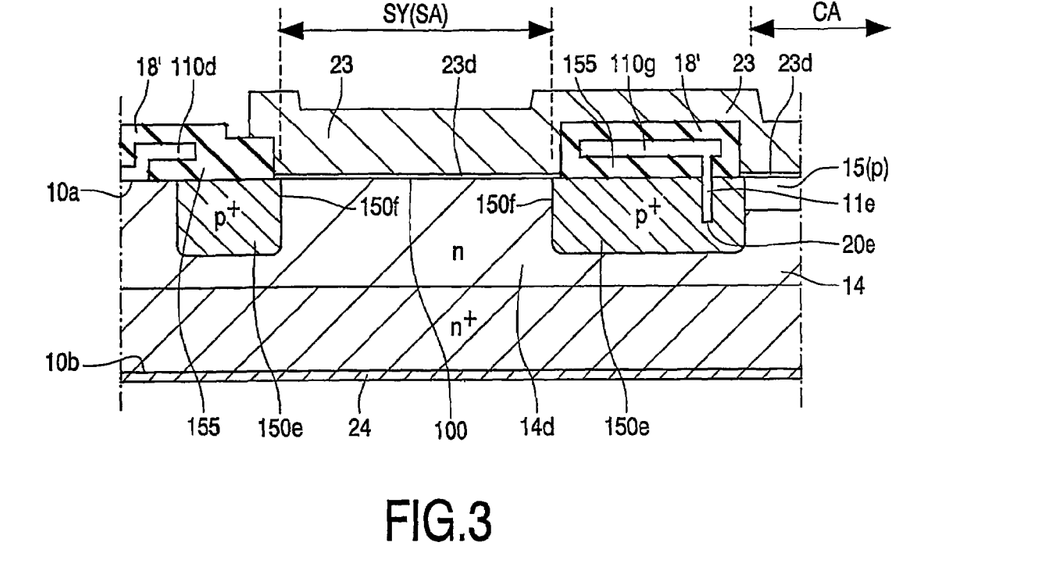
FIG. 3 is a cross-sectional view of one example of an edge-termination deep end region of such a device as FIG. 1, taken on the line III—III of FIG. 1.

FIGS. 1 to 3 illustrate an exemplary embodiment of a cellular power MOSFET in accordance with the present invention. In the cellular areas CA of this device, each transistor cell has a channel-accommodating region 15 of a second conductivity type (p-type in this example) that separates source and drain regions 13 and 14, respectively, of a first conductivity type (n-type in this example). The drain region 14 is common to all the cells.

Being a MOSFET of the trench-gate type, the device has its gate electrode 11 in an insulated trench 20 that extends through the regions 13 and 15 into an underlying portion of the drain region 14. The individual cells (of elongate stripe geometry in FIG. 1) are laterally bounded by this trench-gate 11. In the simplified depiction of FIG. 1, the continuous trench-gate 11 is represented by a broken line (for distinction in the drawing from deep end regions that are described below). The gate 11 is capacitively coupled to the region 15 by an intermediate dielectric layer (not shown), i.e. at the insulated walls of the trench 20. The application of a voltage signal to gate 11 in the on-state of the device serves, in known manner, for inducing a conduction channel in the region 15 and for controlling current flow in this channel between the source and drain regions 13 and 14.

The source region 13 is located adjacent to the top major surface 10a of the device body 10, where regions 13 and 15 are contacted by a source electrode 23. The trench-gate 11 is insulated from the overlying electrode 23 by an intermediate insulating overlayer 18 (sometimes termed "capping" layer 18). The region 14 is a drain-drift region, which may be formed by an epitaxial layer of high resistivity on a more highly-doped substrate 14a of the same conductivity type. The substrate 14a is contacted at the bottom major surface 10b of the device body 10 by a drain electrode 24. Thus, the MOSFET of FIGS. 1 to 3 is a vertical power device structure.

The specific cellular device shown in FIG. 1 comprises four cellular areas CA, each of which has a respective end structure at its lateral boundary. The end structure is either an annular edge termination (FIG. 3) in the annular peripheral area PA of the device or a cross stripe structure (FIG. 2) that extends between neighbouring cellular areas CA. In each case, the end structure includes an end region 150 of the second conductivity type (i.e. p-type in this example) that extends to a greater depth in the body 10 than do the channel-accommodating region 15 and the gate trench 20.

The end region 150 adjoins the channel-accommodating region 15 and has a higher doping concentration P+ than the channel-accommodating region 15. In the simplified depiction of FIG. 1, the lateral perimeters of these end regions 150 are represented by continuous lines. In the specific embodiment as depicted in FIG. 1, the end regions 150 of both the annular edge termination and the two cross stripes merge together to form a continuous network pattern. However, the cross stripes 150c and 150b may terminate short of the annular termination region 150e and so form one or more separate islands in the layout pattern of the end region 150. Although FIG. 1 shows only four cross stripes 150c and 150b, a larger number of cross stripes or islands 150c and 150g may be included in the layout pattern of the end region 150. Indeed, a large distribution of the deep end regions 150 among the cellular areas CA is beneficial in suppressing parasitic bipolar transistor effects between the source and drain regions 13 and 14 and improving the MOSFET ruggedness.

In accordance with the present invention, one or more of the deep end regions 150 of these respective end structures in the device of FIGS. 1 to 3 are laterally divided to accommodate a Schottky diode area SA within the deep end region 150. By way of example, FIG. 1 illustrates the incorporation of four such diode areas SA within the annular termination region 150e and two such diode areas SA within the cross stripe regions 150c. For clarity in the drawing, these diode areas SA are hatched in the plan view of FIG. 1.

At each diode area SA of the body 10, the MOSFET device comprises a Schottky diode connected in parallel with the conduction channel of the MOSFET. Thus, the diode has a Schottky barrier 100 integrated between the source electrode 23 and a diode portion 14d of the drain region 14. This diode portion 14d of the first conductivity type (i.e. n-type in this example) extends upwardly through the laterally-divided deep end region 150 of the second conductivity type (i.e. p-type in this example), to the body surface 10a. The Schottky barrier 100 terminates laterally in the laterally divided portions 150f of the deep end region 150, which serve as a guard region and field-relief region for the Schottky diode.

Because of their depth, these laterally-divided portions 150f provide good relief of the electric field in the drain portion 14d that they laterally bound. Thus, the depletion layer formed in a blocking state of the device spreads laterally from the p-n junctions with the portions 150f, as well as vertically from the Schottky barrier. The Schottky diode can therefore have good blocking characteristics. FIGS. 2 and 3 diagrammatically show quite a large spacing SY for these field-relief portions 150f. However, it should be understood that the spacing SY of the portions 150f can be quite small, for example sufficiently close as to permit depletion of the diode portion 14d of the drain region 14 (across this close spacing) in the blocking state. This is advantageous for both increased field-relief and for achieving a compact structure.

In the particular embodiment illustrated in FIG. 1, the layout of each of the Schottky diode areas SA is of an elongate stripe geometry. This elongate geometry permits the achievement of both a close spacing SY of the field-relief portions 150f (i.e. across the stripe) and a large area for the Schottky barrier 100 (i.e. due to the length of the stripe). However, other layout shapes may be adopted for a Schottky diode area SA, where such would fit within the layout geometry of the deep end region 150.

FIG. 1 shows six separate areas SA in the end-region network 150e and 150c. However, these separate areas may merge together into a continuous area SA so as to maximize the area of the Schottky diode. This can save layout area in integrating the Schottky diode, and the spacing SY can be keep small for a given Schottky barrier area and forward voltage of the diode (that is proportional to the Schottky barrier area).

FIG. 3 illustrates a Schottky diode area SA in the annular edge termination region 150e around the annular peripheral area PA of the device. In the particular embodiment illustrated in FIG. 1, these diode areas SA extend around most of the device perimeter. As is usual for a MOSFET, the device termination structure also includes a field insulator 155, typically comprising one or more layers of silicon dioxide and/or silicon nitride. This field insulator 155 adjoins the deep end region 150e where the diode area SA is accommodated but is absent from the drain portion 14d of the diode. FIG. 3 also illustrates inclusion, on the field insulator 155, of an outwardly-directed field plate 110g that is connected to the MOSFET gate 11 and an inwardly-directed field plate 110d that is connected to the MOSFET drain region 14. The gate connection for field plate 110g is provided at lateral extensions 11e and 20e of the gate 11 and trench 20 in the deep termination region 150e, as illustrated in FIG. 3.

FIG. 2 illustrates the inclusion of a Schottky diode area SA in a cross stripe region 150c that extends between two neighbouring cellular areas CA. As shown in FIG. 1, the active device cells of these two areas CA have their stripe-shaped cell geometry parallel to the region 150c. In the simple and compact form illustrated in FIG. 2, there is an absence of the field insulator 155 from the region 150c.

In the specific embodiment of FIG. 1, no diode area SA is included in the cross stripe region 1 sob. Instead, the stripe region 150b forms part of a gate bus-bar structure that carries a metal gate-connection track (not shown) between neighbouring cellular areas CA. The region 150b extends to a further part 150g of the deep end region 150 that is located below the metal gate-terminal bond-pad (also not shown). The metal gate-connection track and the metal gate-terminal bond-pad are connected to lateral extensions 11b of the trench-gate 11 in the parts 150b and 150g of the deep end region 150.

Typically, the semiconductor device body 10 is of monocrystalline silicon. In a specific example for a 30v device, the various regions of the device may be as follows.

The drain drift region 14 (typically an epitaxial layer) may have a uniform doping n of about $2 \times 10^{16}$ or $3 \times 10^{16}$ phosphorus or arsenic cm$^{-3}$, or it may have a graded doping from about $1 \times 10^{16}$ cm$^3$ at the surface 10a to about $3 \times 10^{17}$ cm$^{-3}$ adjacent to the substrate 14a. This doping and the thickness of the region 14 depends on the desired voltage blocking capability of the device. In order to form the Schottky barrier 100 of desired barrier height to the drain portion 14d with this doping, it is advantageous to include a silicide layer 23d at the body surface 10a. Thus, the bulk of the source electrode 23 may be of an aluminium-silicon alloy and the layer 23d may be of, for example, titanium silicide. This silicide layer 23d forms an ohmic contact to the field-relief portions 150f in the diode area SA. The silicide layer 23d may also be included in the active cell areas CA to form good ohmic contacts between the source electrode 23 and the channel region 15 and source region 13 and so reduce source contact resistance.

In a specific example, the doping of P+ region 150 may be about $10^{18}$ boron cm$^{-3}$, whereas that of the channel-accommodating region 15 is typically about $10^{17}$ boron cm$^{-3}$. The depth (from the surface 10a) of P+ region 150 may be about 2.5 µm (micrometres), for example approaching twice that of the region 15 for a trench-gate depth of about 1.5 µm or 1.7 µm. In the blocking state of the MOSFET, the greater doping and depth of the P+ region 150 pushes the depletion layer (in region 14) further towards the substrate 14a in this boundary area of the cellular areas CA and diode areas SA. This is advantageous in increasing the field-relief for the Schottky diode accommodated in this deep region 150, as well as in improving the MOSFET ruggedness against breakdown in the active cells of the adjacent areas CA.

The gate dielectric layer is typically of thermally grown silicon dioxide or of deposited silicon dioxide, although it may comprise silicon nitride. Typically, the trench-gate 11 is of conductively-doped polysilicon, although it may comprise a silicide and/or a refractory metal.

The Schottky diode areas SA can be integrated in the device of FIGS. 1 to 3 in a simple, reliable and low-cost manner, using the following process technology that is also in accordance with the present invention. In broad overview, the process includes the steps of:

(a) providing a semiconductor wafer body 100 having a body portion 14' of the first conductivity type for the drain drift region 14 of the MOSFET device, (b) locally doping the body to provide the end region 150 of the second conductivity type, including the laterally divided portions 150f in its layout to accommodate the diode areas SA within the end region 150, (c) forming the active device cells in the cellular area CA, and (d) forming, at the diode areas SA, the Schottky barrier 100 which terminates laterally in the laterally divided portions 150f of the end region 150.

Figure 4:
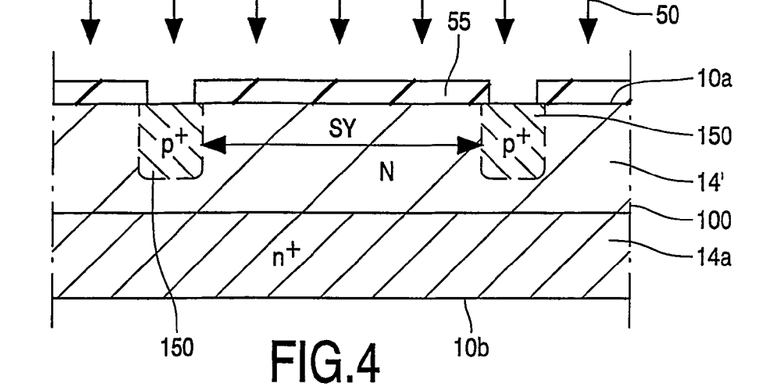
FIGS. 4 to 6 are cross-sectional views of the device part of FIG. 2 at successive stages in its manufacture by one example of a method in accordance with the present invention.

Typically an n-type epitaxial layer having a doping as specified above is provided to form the body portion 14' for the drain drift region 14. FIG. 4 illustrates stage (b) with a boron ion implantation 50 to provide the P+ region 150 in the epitaxial layer 14'. The layout pattern of the P+ region 150 as illustrated in FIG. 1 is defined by an implantation mask 55, for example of photoresist. In a specific example, a boron dose of about $5 \times 10^{13}$ cm$^{-2}$ ions may be implanted at an energy of about 250 keV. The dose and energy are chosen to make the region 150 more highly doped (P+) than the later-provided channel-accommodating region 15 and deeper in the body 10 than the region 15 and the later-etched trench 20, 20e.

After removing the mask 55, the field insulator 155 is then provided in the peripheral area PA for the device termination and additionally over the diode areas SA. Thus, additional areas of field insulator 155 are provided over the diode areas SA in the device termination and in the P+ cross regions 150c.

Figure 5:
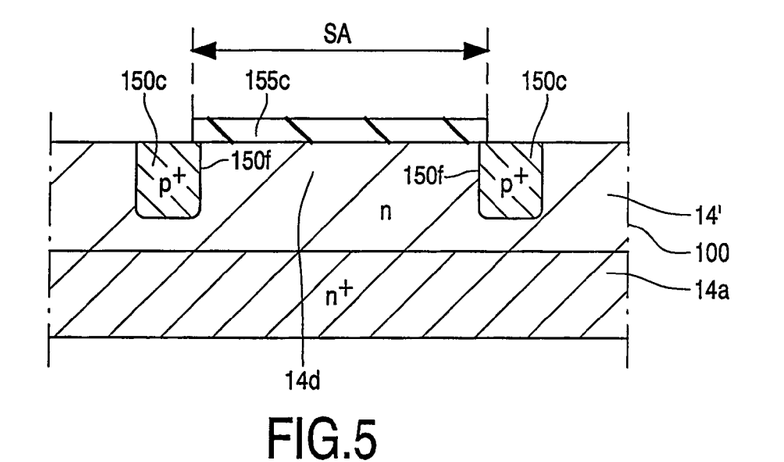

FIG. 5 shows the additional area 155c of the field insulator layer for a P+ cross region 150c. The field insulator 155, typically a thick oxide layer, is preferably of deposited material, rather than a thermally grown (LOCOS) oxide. Deposition of the material has less effect on the boron doping concentration of the underlying P+ region 150.

Figure 6:
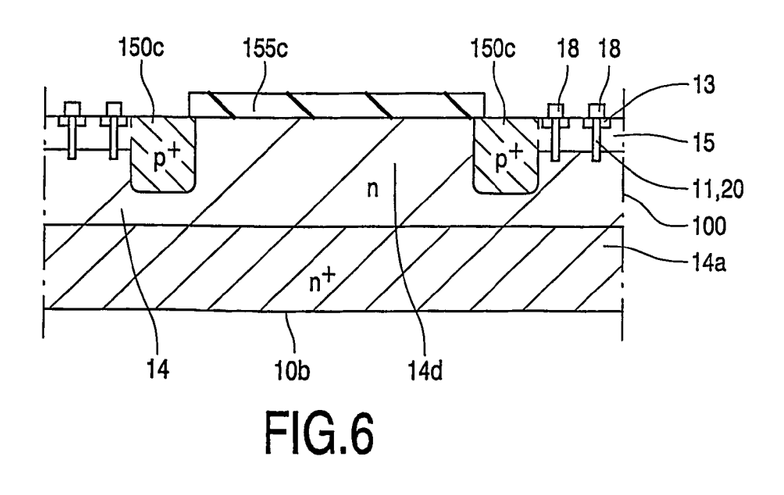

The field insulator layer 155 serves to mask the peripheral area PA and diode areas SA of the epitaxial layer 14' during the formation of the active device cells, as illustrated by additional area 155c in FIG. 6. The active device cells can be formed in known manner, for example, with (in broad overview) the following stages:

(c)(i) etching the gate trench 20 (and its extension 20e) at windows in a trench-etch mask;

(c)(ii) lining the trench 20 (and its extension 20e) with the gate dielectric, for example by oxidation of the sidewalls and bottom of the trench;

(c)(iii) providing the gate 11 (and its extensions 11e and, for example, any extensions thereof as part of a field-plate) by deposition and etch-patterning;

(c)(iv) implanting the channel-accommodating region 15 and source region 13, and (c)(v) forming the insulating capping layer 18 on the trench-gate 11 by deposition or oxidation, and usually also increasing the doping of the region 13 adjacent to the surface 10a.

During these stages (c)(i) to (c)(v), the additional areas of the field insulator layer 155 masks the diode areas SA. These additional areas are subsequently removed from the diode areas SA before forming the silicide layer 23d to provide the Schottky barrier 100 in step (d). Thus, the additional area 155c is removed, as shown in the corresponding device part of FIG. 2.

The silicide layer 23d may be deposited on the silicon surface 10a, and/or the silicide-forming metal (for example, titanium) may be alloyed into the silicon surface 10a.

Thereafter, the manufacture is completed in known manner. Thus, one or more metal layers (for example, comprising aluminium) are deposited and defined in a photolithographic and etching step into the desired pattern for the source electrode 23 and the metal gate-connection track and the gate bond-pad. For this purpose, multiple-levels of metal (with intermediate dielectric) may be used, particularly if metal parts are desired for field-plates (such as 110g and 110d of FIG. 3). The back surface 10b is then metallised to form the drain electrode 34, after which the wafer body 100 is divided into the individual device bodies 10.

It will be evident that many modifications and variations are possible within the scope of the present invention. Considerable flexibility is possible in the specific technologies and constructions that can be used in providing and defining the regions and layers 14, 155, 150, 11, 15, 13, 18, 23d, 23 etc.

FIG. 7 illustrates one important modification in the field-relief structure for the Schottky diode. In this device, the MOSFET termination structure includes a field insulator 155x accommodated in a field trench 255 that extends to a greater depth in the body than both the deep end region 150 and the gate trenches 20, 20e. Preferably the field trench 255x extends close to the interface with the substrate 14a or even into the substrate 14a. For a given breakdown voltage, the spacing SY in the FIG. 7 diode can be larger than that for the diode of FIGS. 2 and 3.

In this embodiment of the invention, the trenched field insulator 155x laterally bounds the laterally-divided portions 150f of the deep end region 150e that provide the guard region and field-relief region for the Schottky diode. The inclusion of these field trenches 255 serves to reduce field spreading beneath the deep end region 150e at the lateral boundary of the diode portion 14d of the drain region 14, as illustrated by the plots in FIG. 7. Thus, in FIG. 7, the extent of the depletion layer in the regions 14 and 150e is represented by the broken line 40, whereas the solid lines represent the electric field in these regions 14 and 150e and in the dielectrics 155x and 155.

It can be seen from FIG. 7, that the potential lines in the drain portion 14d of the diode are well spread (with no field peak concentrations), and are well balanced between the P+ field-relief portions 150f at opposite sides of the spacing SY. Thus, the potential contours are relatively flat as they cross the Schottky spacing SY. This is due to the effect of the dielectric 155x in the bounding trenches 255 in spreading the potential contours, thereby raising the reverse breakdown of the Schottky diode. Thus, the breakdown of the Schottky diode is considerably higher than the breakdown of the active trench-gate MOSFET area. Breakdown will occur in the MOSFET active area, without the usual high leakage current normally seen with planar Schottky diodes, because the Schottky diode is still far from reaching it reverse breakdown limit.

FIG. 8 shows a simulation of the near ideal breakdown characteristic (plot B) that results from adopting a FIG. 7 field-relief structure for the Schottky diode. Two plots of leakage current Ir in $10^{-3}$ Amps against reverse voltage Vr in volts at 100° C. are given in FIG. 8. Plot B is for a Schottky diode having a deep end region and deep field trench configuration as in FIG. 7. Plot C is for a Schottky diode having an n-type diode portion 14d of width SY, that is laterally bounded by trench-gates of the MOSFET cells, i.e. similar to the Schottky diode structures disclosed in U.S. Pat. No. 6,049,108 and WO-00/51167. In each case, the area of the Schottky barrier 100 was 2 mm², with a width SY of 1 µm. As can be seen from plot C, the leakage current from the comparison diode is already almost 1 milliAmp at a reverse voltage of 30V. The diode of FIG. 7 configuration has still a minimum leakage current at 30V, with no significant increase until an abrupt breakdown at 60V. Indeed, as depicted by plot B, the FIG. 7 diode substantially exhibits a typical MOSFET-like leakage profile, but with an increased reverse breakdown capability. A comparable plot is obtainable for the FIG. 3 diode, i.e. with a minimum leakage current still at 30V, but with a lower increased reverse breakdown capability, for example in the range of 45V to 50V.

Typically, for both FIGS. 3 & 7 diodes, the spacing SY can be upward from about 1 µm or less. However, it is more difficult to achieve a very high breakdown for the FIG. 3 Schottky diode (without field-oxide trenches 155x,255). If the spacing SY in this diode is made too large, then depletion-induced lowering of its barrier height can occur. Effectively, this means an increase in its leakage current. Hence, the spacing SY in the FIG. 3 diode should be kept small in order to achieve a low leakage current with effective field relief from the regions 150f.

Figure 9:
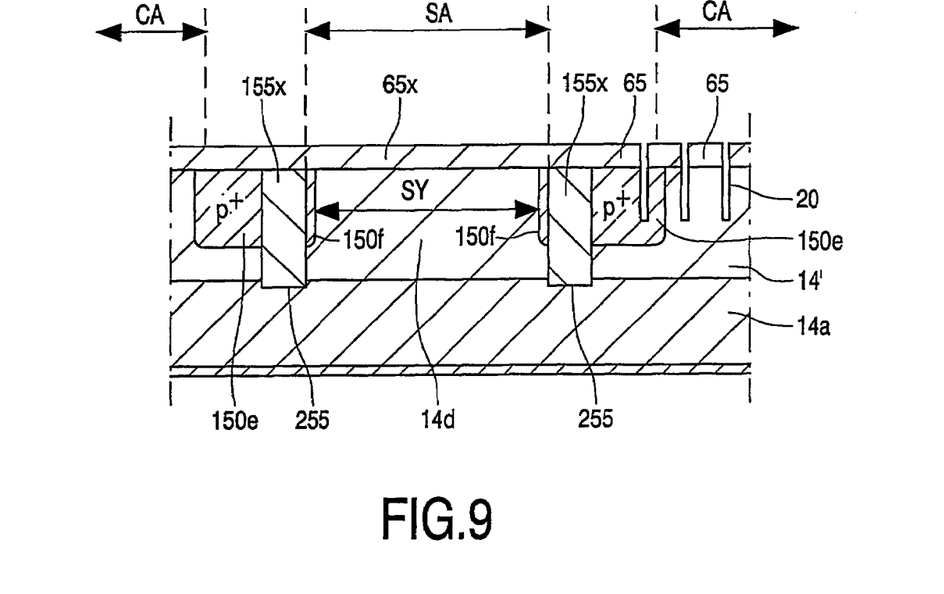
FIG. 9 is a cross-sectional view of the device part of an edge termination structure, similar to that of FIG. 7, at a stage in its manufacture also in accordance with the present invention.

The FIG. 7 diode structure can be formed readily by etching the field trenches 255 after the P+ doping stage of FIG. 4 and before depositing the field insulator 155, 155x. FIG. 9 illustrates a particularly advantageous embodiment of how it may be incorporated into the device termination. In this embodiment, the diode area SA is masked with a trench-gate etch-mask layer 65 during the formation of the active device cells in step (c). Thus, as in FIGS. 1 to 6, the MOSFET device is of the trench-gate type, having its gate electrode 11 accommodated in a trench 20. The trench 20 is etched into the body in step (c)(i), at windows in an etch-mask layer 65 that is shown in FIG. 9. This etch-mask layer 65 may be of, for example, silicon nitride on a thin oxide layer on the body surface 10a.

In this particular method of manufacture in accordance with the invention, an additional part 65x of the etch-mask layer 65 is provided over the diode area SA to mask the diode area SA during the cell formation in steps (c)(i) to (c)(v). FIG. 9 illustrates the situation during the etching of the gate trenches 20 in step (c)(i). The part of the layer 65 on the cellular areas CA in FIG. 9 is the first to be removed as appropriate for carrying out the steps (c)(ii) to (c)(v). Only thereafter, the part 65x is removed from the diode area SA for the formation of the Schottky barrier 100 in step (d).

Part of the etch-mask layer 65 may be retained in the device termination as a part of the field insulator.

Many other modifications and variations will be apparent to the person skilled in the art.

Figure 10:
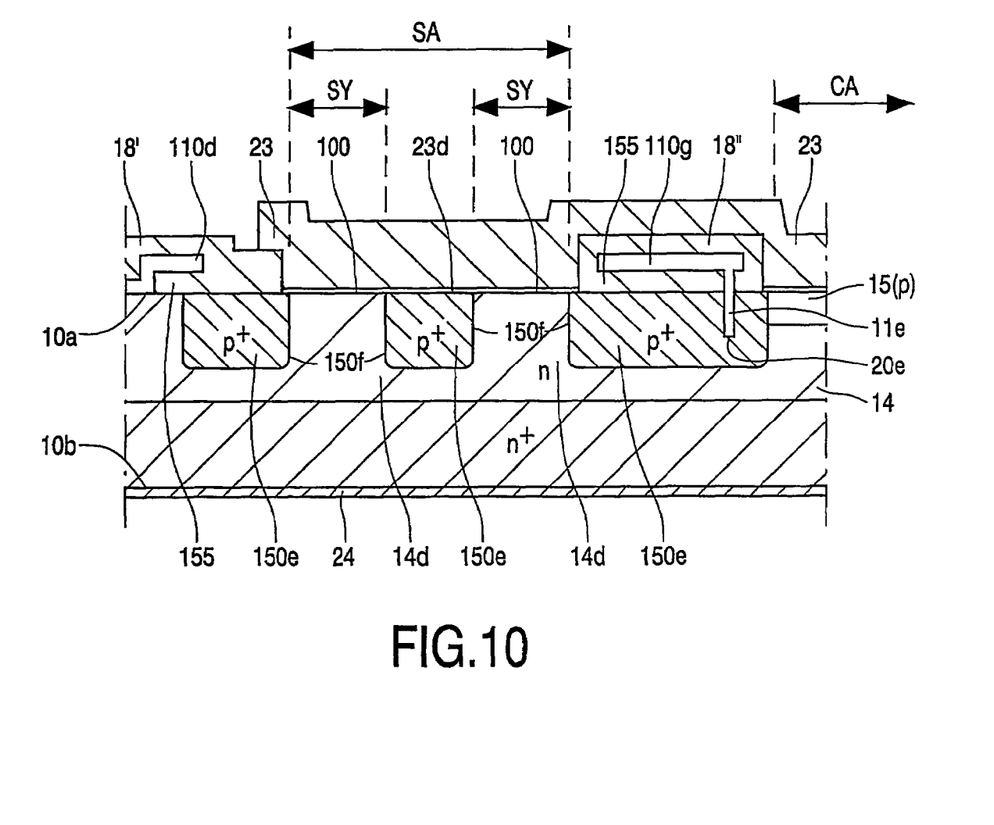
FIG. 10 is a cross-sectional view, similar to FIG. 3, of the device part of an edge termination structure of a modification also in accordance with the invention, having side-by-side Schottky diodes in the end region.

FIGS. 1 to 7 show only one diode area SA in each laterally-divided deep end region 150. However, a plurality of such diode areas SA (for example, side-by-side stripes) may be provided in one laterally-divided deep end region 150. FIG. 10 illustrates one such modification of the FIG. 3 diode, having two side-by-side stripe areas each of width SY. More than two such side-by-side areas may be included, for example to reduce the individual widths SY or to increase the total area of the Schottky barrier 100.

As already described, it is desirable to have a small spacing SY for the Schottky diodes of FIGS. 2 & 3 in order to achieve a low leakage current with effective field relief from the regions 150f without field-oxide trenches 155x, 255. Otherwise, depletion induced lowering of the Schottky barrier height can occur. This assumes a typical situation in which the doping concentration (P+) of the regions 150f is so high that the spread therein of the depletion layer is small.

However, an alternative approach is possible using a lower doping concentration. In this case, the laterally divided end regions 150, 150f may be implanted with such a doping concentration and profile that charge balance is achieved between the p-type depleted portions 150f and the n-type depleted portion 14d. Such charge balance is a modified application of the teaching of U.S. Pat. No. 4,754,310 (Philips ref: PHB32740), the whole contents of which are hereby incorporated herein as reference material. By this modification, the breakdown capability of the integrated Schottky diodes of FIGS. 2, & 10 can be much improved and the leakage current can be reduced. This would permit the spacing SY to be increased.

Instead of forming the drain-drift region 14 by an epitaxial layer on a higher-doped substrate 14a, the higher doped region 14a of some discrete devices may be formed by dopant diffusion into the back surface 10b of a high-resistivity substrate that provides the drift region 14.

Vertical discrete devices have been described so far, having their second main electrode 24 contacting the substrate or other highly-doped region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 24 at the front major surface 10a, via a doped contact region which extends from the surface 10a to the depth of the buried layer.

The particular examples described above are n-channel devices, regions 13 and 14 are of n-type conductivity, regions 15, 150 and 35 are p-type, and an electron inversion channel is induced in region 15 by the gate 11. By using opposite conductivity type dopants, a p-channel device can be manufactured by a method in accordance with the invention. In this case, the regions 13 and 14 are of p-type conductivity, the regions 15, 150 and 35 are n-type, and a hole inversion channel is induced in the region 15 by the gate 11.

Although the embodiments so far shown are of the trench-gate type, the present invention may also be used to integrate Schottky diode areas SA into laterally-divided deep end regions 150 of MOSFETs of the DMOS type.

Semiconductor materials other than silicon may be used for devices in accordance with the invention, for example silicon carbide.

From reading the present disclosure, other variations and modifications will be apparent to persons skilled in the art. Such variations and modifications may involve equivalent and other features which are already known in the art and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom. Thus, for example, the embodiment of FIGS. 7 and 9 keeps the P+ field portions 150*f* of the end region 150 in the diode area SA. However, an integrated Schottky diode structure could be formed having its n-type drain diode portion 14*d* laterally bounded (throughout its depth from the surface 10*a*) by the insulator-filled field trenches 255,155*x*, i.e. without the field portions 150*f*. In the manufacture of this modified diode, the lateral spacing SY that divides the end region 150 (in a modification of FIG. 9) may be made wider, so that the etching of field trenches 255 removes the P+ portions 150*f*. Such a diode structure is much less advantageous than that of FIG. 7. However, such a Schottky diode structure (with the field-insulator trenches 155*x*,255, but without the field portions 150*f*) is apparently novel. Accordingly, the Applicants reserve the right to file patent claims to such a Schottky diode structure in the course of the prosecution of the present patent Application or of any further Application derived therefrom.

What is claimed is:

1. A cellular MOSFET device comprising active device cells in a cellular area of a semiconductor body, wherein:
    each active device cell has a channel-accommodating region of a second conductivity type between a surface-adjacent source region and an underlying drain region that are of a first conductivity type, a gate electrode dielectrically coupled to the channel-accommodating region for controlling a conduction channel between the source and drain regions in operation of the device, and a source electrode connected to the source region and to the channel-accommodating region;
    the cellular area is laterally bounded by an end structure including a deep end region of the second conductivity type that adjoins the channel-accommodating region and has a greater depth and a higher doping concentration than the channel-accommodating region;
    the device also comprises, at a diode area of the body, a Schottky diode having a Schottky barrier that is integrated between the source electrode and a diode portion of the drain region that is of the first conductivity type; and
    the deep end region is laterally divided to accommodate the diode area within the deep end region of the end structure, with the diode portion of the first conductivity type extending upwardly through the deep end region of the second conductivity type, and with the Schottky barrier terminating laterally in the laterally divided portions of the deep end region which serve as a field-relief region for the Schottky diode.

2. A device according to claim 1, wherein the deep end region extends around a perimeter of the device as part of a device termination structure and also extends across at least part of the device as a stripe structure between active device cells to accommodate the diode area as a stripe between two cellular areas of the device.

3. A device according to claim 1 or claim 2, wherein the deep end region is part of a device termination structure that extends around a perimeter of the device, and the diode area is accommodated around at least a part of the perimeter of the device.

4. A device according to claim 2, wherein the active device cells are of a stripe-shaped geometry parallel to the stripe structure that accommodates the diode area.

5. A device according to claim 2 or claim 4, wherein the device termination structure includes a field insulator that is absent from the stripe structure.

6. A device according to claim 2, wherein the device termination structure includes a field insulator adjacent to the deep end region where the diode area is accommodated in the termination structure.

7. A device according to claim 6, wherein the field insulator comprises deposited insulating material accommodated in a field trench, which trench extends to a greater depth in the body than the deep end region and laterally bounds the portions of the deep end region that provide the field-relief region of the diode.

8. A device according to claim 7, wherein the gate is a trench-gate accommodated in an insulated gate trench that extends from the source region through the channel-accommodating region and into the underlying drain region, and the insulated gate trench is shallower than the field trench.

9. A device according to claim 1, wherein the gate is a trench-gate accommodated in an insulated gate trench that extends from the source region through the channel-accommodating region and into the underlying drain region, and a lateral extension of the insulated gate trench terminates in the deep end region as part of a device termination structure, the deep end region being deeper than the insulated gate trench and its lateral extension.

10. A device according to claim 1, wherein there is a sufficiently close spacing of the laterally divided portions of the deep end region to permit depletion of the diode portion of the drain region across this close spacing in a blocking state of the device.

11. A method of manufacturing a cellular MOSFET device comprising active device cells in a cellular area of a semiconductor body and also comprising, at a diode area of the body, a Schottky diode having a Schottky barrier that is integrated between a diode portion of the drain region and a source electrode, wherein the method comprises the steps of:
    (a) providing the semiconductor body having a body portion of a first conductivity type for a drain region of the MOSFET device,
    (b) locally doping the body to provide an end region of the second conductivity type for an end structure that laterally bounds an area of the body that provides the cellular area, which end region is laterally divided to accommodate the diode area within the end region of the end structure, with a diode portion of the drain region extending upwardly through the end region,
    (c) forming the active device cells in the cellular area, each cell having a channel-accommodating region of a second conductivity type between a surface-adjacent source region and the underlying drain region that are of a first conductivity type, and a gate electrode that is dielectrically coupled to the channel-accommodating region for controlling a conduction channel between the source and drain regions in operation of the device, wherein the end region resulting from the local doping of step (b) adjoins the channel-accommodating region and has a greater depth and a higher doping concentration than the channel-accommodating region, and (d) forming at the diode area the Schottky barrier which terminates laterally in the laterally divided portions of the end region, which laterally divided portions serve as a field-relief region for the Schottky diode.

12. A method according to claim 11, wherein the device termination structure includes a field insulator, an extra area of which is provided over the diode area before step (c), serves to mask the diode area during the formation of the active device cells, and is removed from the diode area before forming the Schottky barrier in step (d).

13. A method according to claim 11 or claim 12, wherein the MOSFET device has a trench-gate of which the gate electrode is accommodated in a trench that is etched into the body in step (c) at windows in an etch-mask layer, and wherein an area of the etch-mask layer is provided over the diode area to mask the diode area during the formation of the active device cells in step (c) and is removed from the diode area before forming the Schottky barrier in step (d).

* * * * *